United States Patent [19]
Harston

[11] Patent Number: 5,519,667
[45] Date of Patent: May 21, 1996

[54] RANDOM ACCESS MEMORY WITH APPARATUS FOR REDUCING POWER CONSUMPTION

[75] Inventor: Stephen W. Harston, Limerick, Ireland

[73] Assignee: Analog Devices, Incorporated, Norwood, Mass.

[21] Appl. No.: 461,028

[22] Filed: Jun. 5, 1995

Related U.S. Application Data

[60] Division of Ser. No. 296,739, Aug. 26, 1994, which is a continuation-in-part of Ser. No. 986,146, Dec. 4, 1992, Pat. No. 5,343,196.

[51] Int. Cl.⁶ ..................................................... G11C 13/00
[52] U.S. Cl. ........................... 365/235; 365/233; 341/136
[58] Field of Search ......................... 365/51, 63, 189.01, 365/227, 238, 235, 233; 341/119, 136, 144

[56] References Cited

U.S. PATENT DOCUMENTS 3,772,658  11/1973  Sarlo ................................ 365/189.01
5,343,196  8/1994  Harston ................................ 365/233

*Primary Examiner*—Terrell W. Fears
*Attorney, Agent, or Firm*—Parmelee, Bollinger, & Bramblett

[57] ABSTRACT

A random access memory (RAM) having an array of memory cells the signal lines to which are activatable by corresponding current sources. The memory is divided into "pages", and control pulses are produced to turn on the current sources involved in activating the signal lines to any page of memory cells being accessed and to turn off the remainder. The control pulses are directed through a pipelined pair of registers, and a look-ahead logic circuit examines the two pipelined control pulses identified as the "present" and "next" pulses. This logic circuitry serves to turn on the current sources for the page of memory to be accessed during the next clock time, and to maintain in an on state the current sources for the page of memory presently being accessed.

4 Claims, 9 Drawing Sheets

FIG. 3
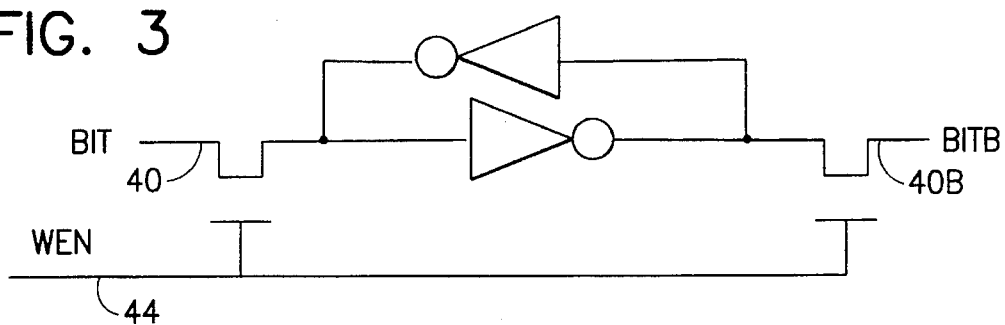
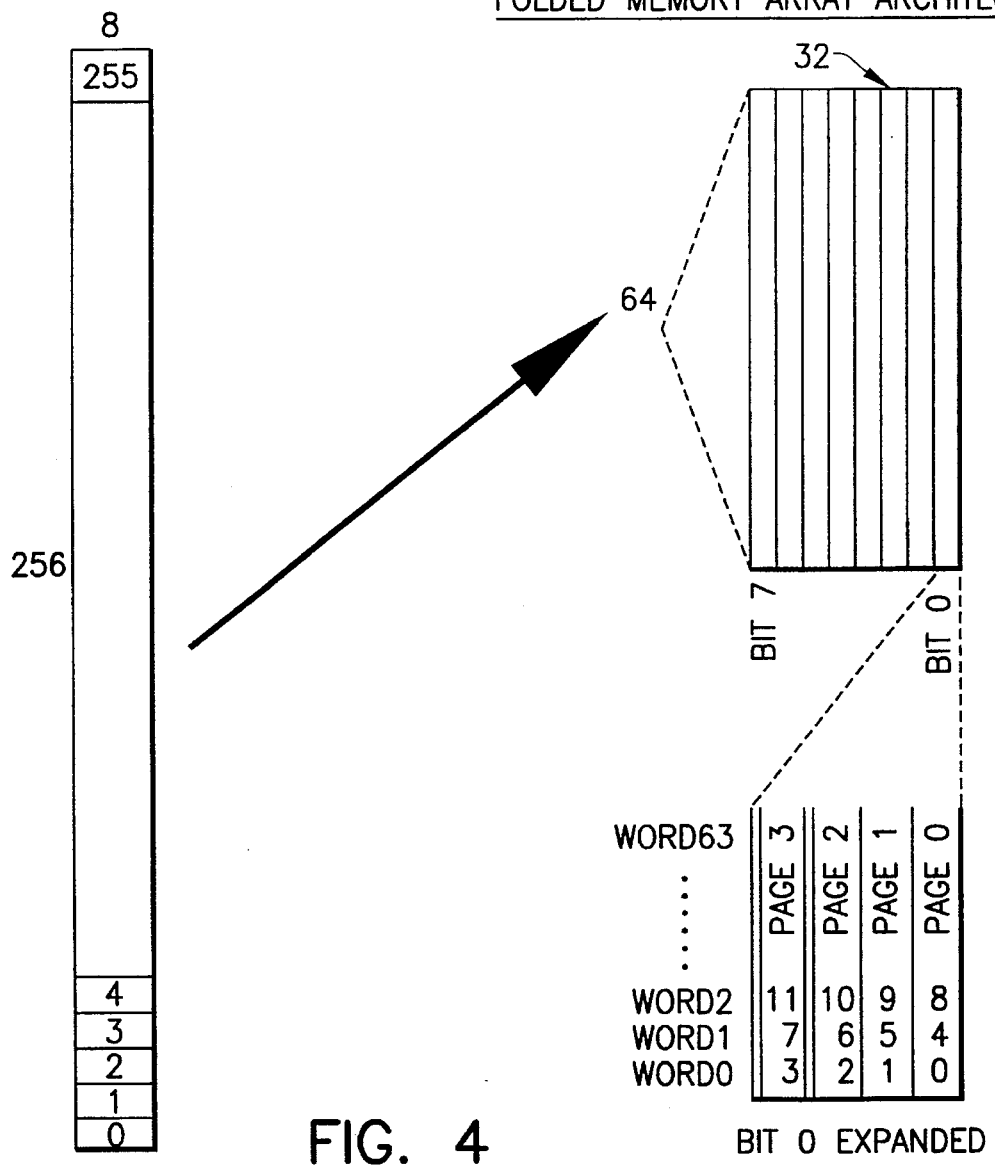
FIG. 4
FOLDED MEMORY ARRAY ARCHITECTURE
BIT 0 EXPANDED

| TRUTH TABLE | | |
|---|---|---|
| PRESENT | NEXT | BIT/BITB CURRENT SOURCE |
| 0 | 0 | OFF |
| 0 | 1 | ON |
| 1 | 0 | ON |
| 1 | 1 | ON |

RANDOM ACCESS MEMORY WITH APPARATUS FOR REDUCING POWER CONSUMPTION

This application is a divisional application of application Ser. No. 08/296,739 as originally filed on Aug. 26, 1994, and which is a continuation-in-part of application Ser. No. 07/986,146, filed by the present inventor on Dec. 4, 1992, now U.S. Pat. No. 5,343,196.

BACKGROUND OF THE INVENTION

1. Field of the Invention

This invention relates to integrated-circuit (IC) chips carrying multi-celled memory devices such as that referred to as a RAM (random access memory). More particularly, this invention relates to techniques for reducing the power consumed by current sources forming part of the chip circuitry.

2. Description of the Prior Art

RAM devices commonly use current sources to activate the circuitry for signal transfer between the memory cells and signal lines associated with the cells. Such current sources typically are required to produce relatively high current levels, and thus consume substantial power. For many modern applications, such as battery-operated lap-top computers, it is very desirable to reduce power consumption. It is the purpose of this invention to effect such power reduction with respect to current sources, and particularly those used for the RAM data transfer circuitry.

SUMMARY OF THE INVENTION

In a preferred embodiment of the invention, to be described below in detail, there is provided a RAM of the type comprising a large number of MOS transistor memory cells including signal lines for transferring the stored data bits to and from the cell. These signal lines are activated by respective current sources which pull up the lines to an operating voltage where data transfer can take place. In the disclosed embodiment, the memory cell array is arranged in separate "pages", each addressable by corresponding address signals. Control circuitry is provided for turning off the current sources for those pages of memory which are not to be accessed.

This control circuitry includes logic responsive to the "present" and "next" control pulses in respective pipelined registers through which the pulses pass on the way to the memory cell circuitry. The output of this logic circuitry is operable to turn off those current sources for which both the "present" and "next" control pulses call for the current sources of a page of memory cells to be turned off. The current sources for any page of memory cells to be read (or written to) are turned on. In the specific described embodiment, at least half of the current sources are turned off at any given time, and in some circumstances three-quarters of the sources are turned off, thus saving considerable power.

BRIEF DESCRIPTION OF THE DRAWINGS

FIG. 3 is a pictorial presentation of the operative elements of the memory cell in FIG. 2;

FIG. 4 is a diagram illustrating the physical disposition of the memory cells of the RAM of FIG. 1 with its folded memory array architecture;

DETAILED DESCRIPTION OF THE PREFERRED EMBODIMENT

Figure 1:
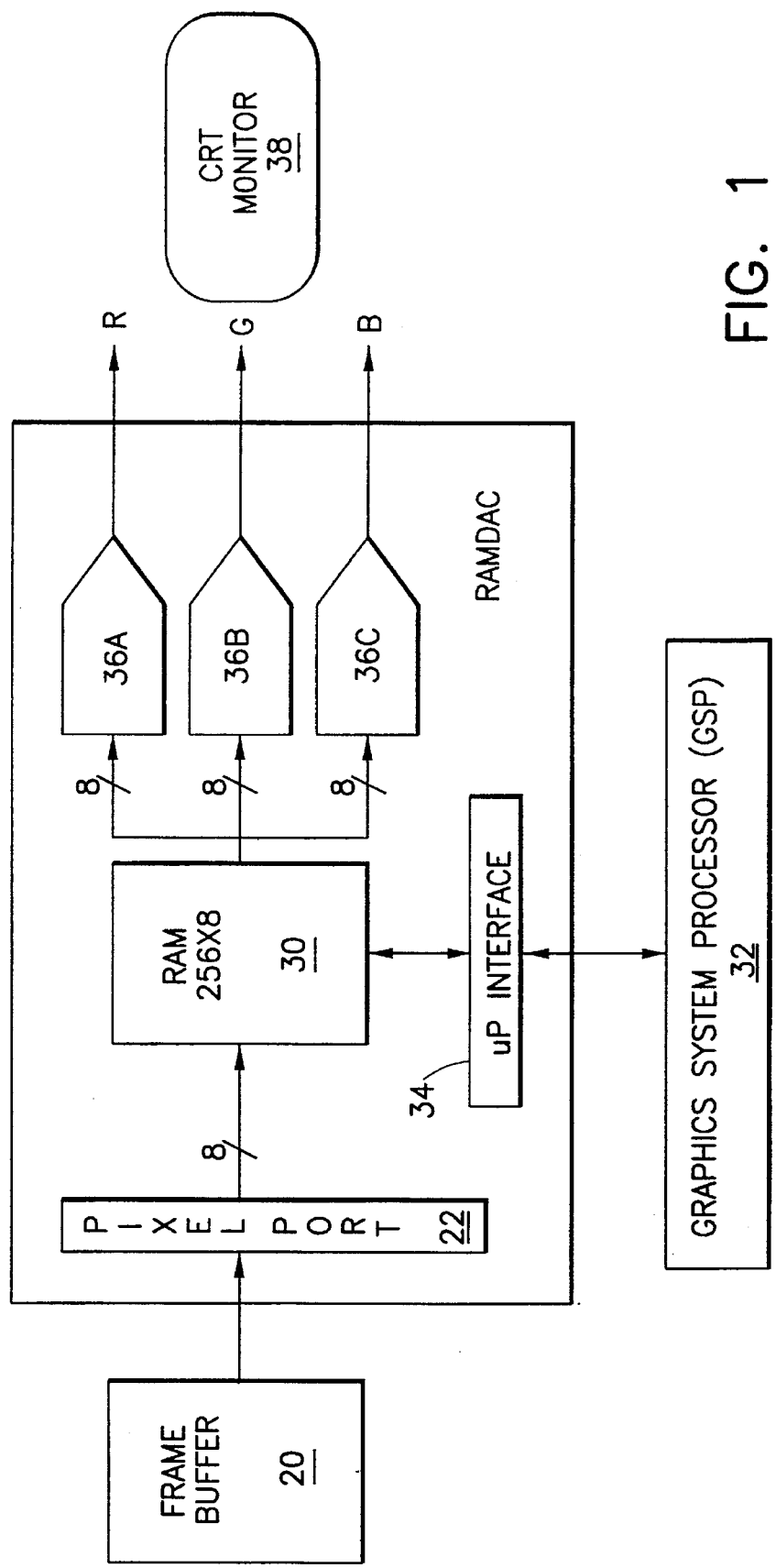
FIG. 1 is a block diagram showing a CRT graphics display system employing a RAM memory device incorporating the present invention.

Referring now to FIG. 1, there is shown a CRT graphics display system of known configuration, such as is shown in U.S. patent application Ser. No. 08/079,641 filed by T. Cummins on Jun. 18, 1993. Such a system includes a frame buffer 20 which supplies digital pixels through a port 22 to a RAM (random access memory) 30. The applied pixels address memory locations in the RAM to read out the stored data.

The RAM 30 is controlled by a graphics system processor 32 operating through an interface 34. The GSP updates the contents of the RAM when required. The pixel-addressed digital data in the RAM is read out at high speed to a set of DACs (digital-to-analog converters) 36A, B, C which produce the red, green, blue analog signals for the CRT monitor 38. Since the RAM and the DACs are on the same chip, the combination is referred to as a RAMDAC. The RAMDAC arrangement shown herein is somewhat simplified, e.g., there ordinarily would be separate memory devices for each of the DACs.

Figure 2:
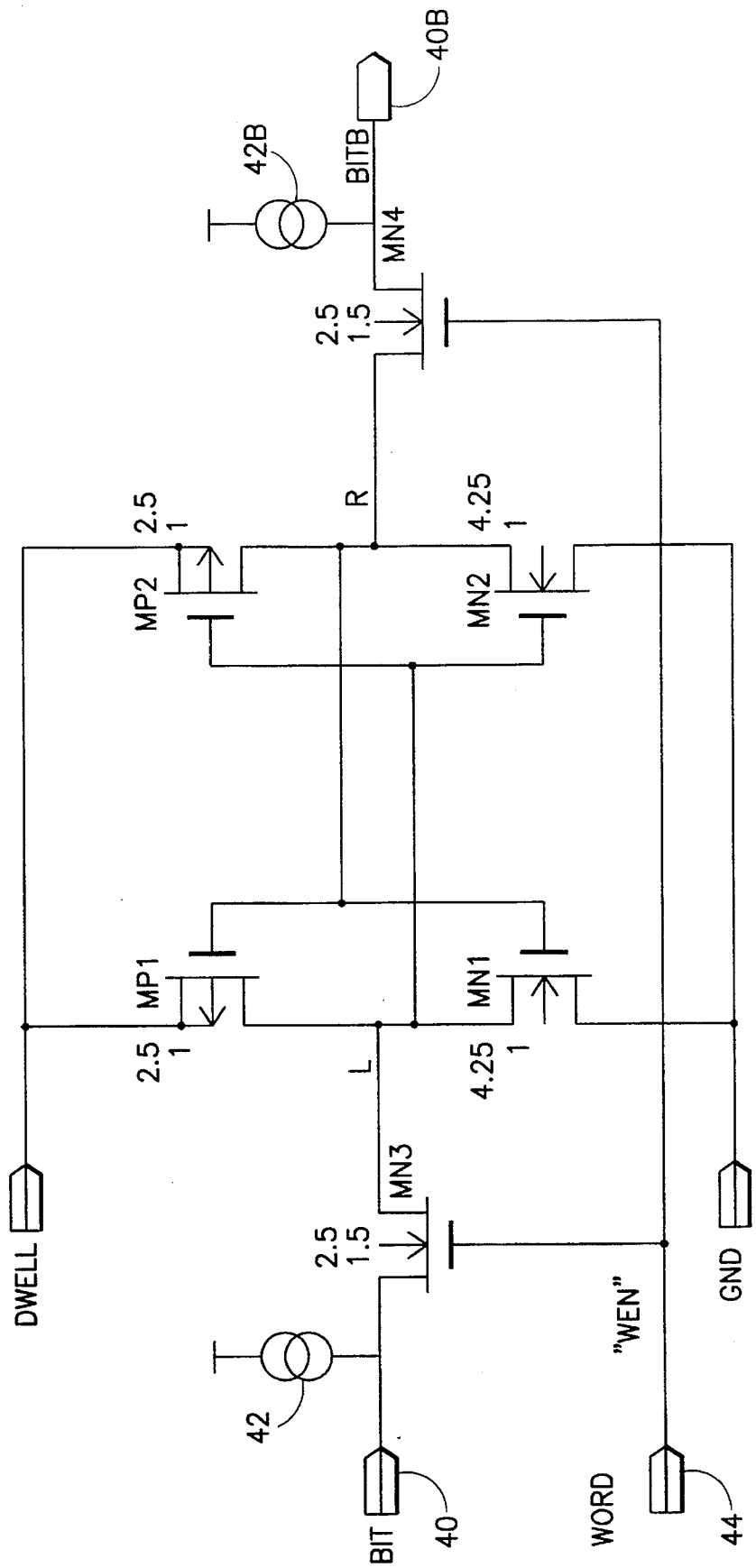
FIG. 2 is a circuit diagram of a memory cell used in the RAM of the system shown in FIG. 1.

FIG. 2 shows circuit details of the memory cells in the RAM 30. Data transfer into and out of the cell is accomplished by a pair of signal lines 40, 40B referred to as Bit and BitB lines. Transferring of data requires that the bit lines be pulled up to an operating voltage, and this is effected by current sources 42, 42B connected to the bit lines respectively. The memory cell is selected for a read/write operation by activating a word line 44, referred to as "WEN" (standing for "word enable").

FIG. 3 illustrates somewhat pictorially the arrangement of the memory cell, showing that it comprises a pair of reverse-connected inverters for storing the data bit. A pair of gated transistors addressable by the WEN line 44 serve to transfer the data bit to (or from) the BIT and BITB lines.

Referring now to FIG. 4, the RAM architecture is determined to a certain extent by chip layout considerations. The RAM in the exemplary embodiment described herein is 256 words by 8 bits/word. If the layout were arranged as 256 rows by 8 columns (as illustrated at the left of FIG. 4), a very narrow shape would result. The preferred shape is more in the nature of a square, i.e., having a fairly large number of columns of words across the horizontal dimension and a fairly large number of rows in the other (vertical) dimension. The aspect ratio ideally would be 1:1, as in a square.

To approach this goal, a "folded memory array" architecture may be used, as shown at the right-hand side of FIG. 4.

In the configuration shown, there are 64 rows in the vertical dimension, with each row having 32 8-bit words across the horizontal dimension. This rearrangement involves taking each column and folding it over four times. Thus, each 256 words × 1 bit becomes 64×4 bits. As shown in FIG. 4, this provides a reasonable aspect ratio of 2:1, by having a relatively large number of multi-bit words disposed across the horizontal dimension. By thus folding the memory cell columns, four "pages" of memory are developed, each with its own set of 16 bit lines rather than having just one page and a single set of 16 bit lines.

Figure 5:
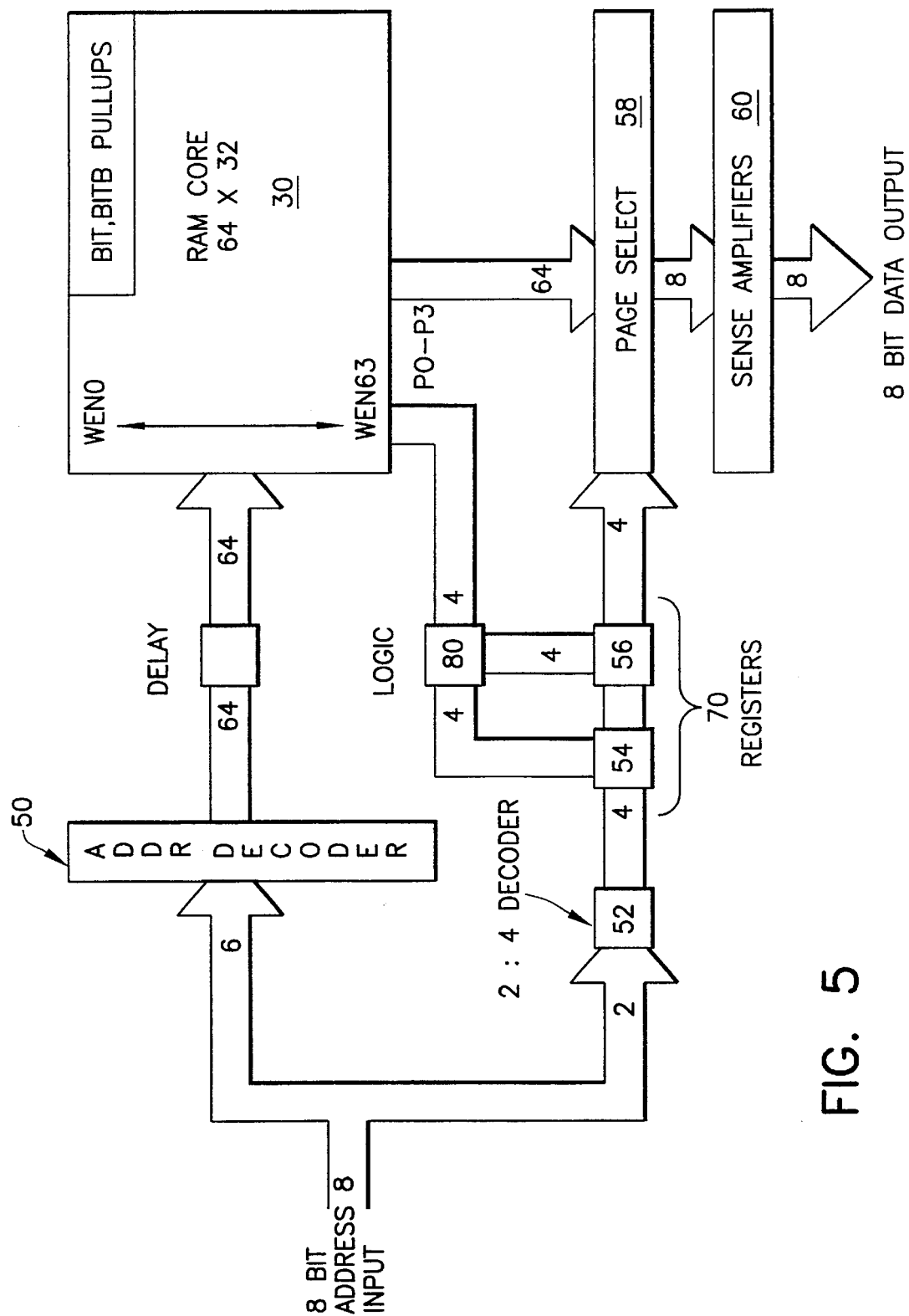
FIG. 5 is a system diagram illustrating the look-ahead pipelined arrangement for determining which current sources are to be turned off.

Referring to FIG. 5, the RAM 30 with this configuration can be addressed by directing the 6 MSBs of the 8-bit address from the frame buffer 20 to an address decoder 50 which develops a corresponding one of 64 word enable (WEN) signals. Each word enable signal drives a total of 32 RAM cells across the array (4 pages per bit ×8 bits). The 2 remaining LSBs are used to address a selected one of the four pages of memory. For that purpose, the two bits are directed to a 2:4 decoder 52 which develops a corresponding one of four possible page select signals (referred to subsequently as SELPG).

The page select signals are control pulses which are clocked through two successive registers 54, 56 to the page select circuitry 58. This circuitry transmits one 8-bit word from the RAM 30 to 8 sense amplifiers 60 to produce the 8-bit digital signal data for the DACs.

Figure 6:
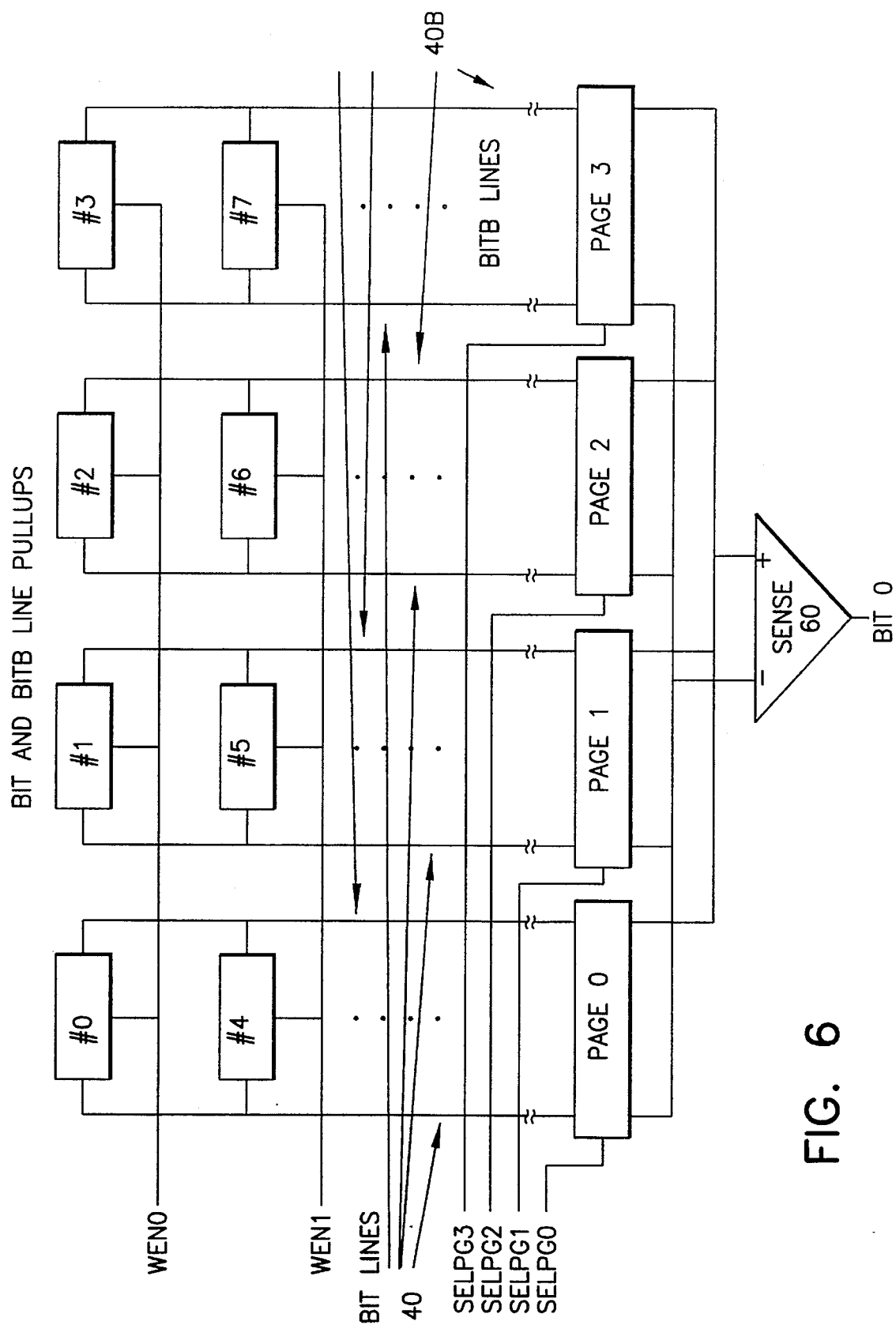
FIG. 6 is a diagram showing the addressing arrangement for developing one bit of an 8-bit word read out from the RAM.

Referring now to FIG. 6, the 512 memory cells in each page have their BIT and BITB lines connected in the manner shown in the circuit arrangement for developing BIT 0 of a selected 8-bit output word from a corresponding set of 64 memory cells. If, for example, the 6 MSBs of the address decode to produce WEN1, then for each of the 8-bits, four RAM cells (Nos. 4, 5, 6 and 7) are selected and enabled onto the corresponding BIT/BITB lines 40, 40B. The page select signal (SELPG 0, 1 . . . etc.) determines which one of the four pairs of bit lines is connected to the sense amplifier 60 to produce the output signal BIT 0. Corresponding circuitry develops the remaining bits B1 through B7.

Since each incoming pixel from the frame buffer 20 will access only one of the four pages of memory, it is only necessary to have the current sources (42, 42B) turned on in this one page of the RAM during the access time. Thus, it is possible to save three-quarters of the current and hence power consumed in the RAM by turning off the current sources for the three pages not accessed by each pixel.

In a further development of this concept, it has been found that superior results are achieved by a "look-ahead" arrangement wherein the page to be accessed is turned on one clock time prior to the time it is actually being accessed, i.e., the current sources for that one page are turned on during the clock time preceding the actual access clock time. This technique is used because the RAM data can be corrupted if the current sources are turned on at the very time the access is being clocked.

In this "look-ahead" arrangement, the control pulses are directed through pipelined sets of clocked pulse registers generally indicated at 70 in FIG. 5. The forward registers 56 contain the "present" pulses for the page then being accessed. The preceding registers 54 contain the "next" pulses (i.e., the following pulses) which will be placed in the forward registers 56 at the next clock time, thereby becoming the "present" control pulses.

Figure 7:
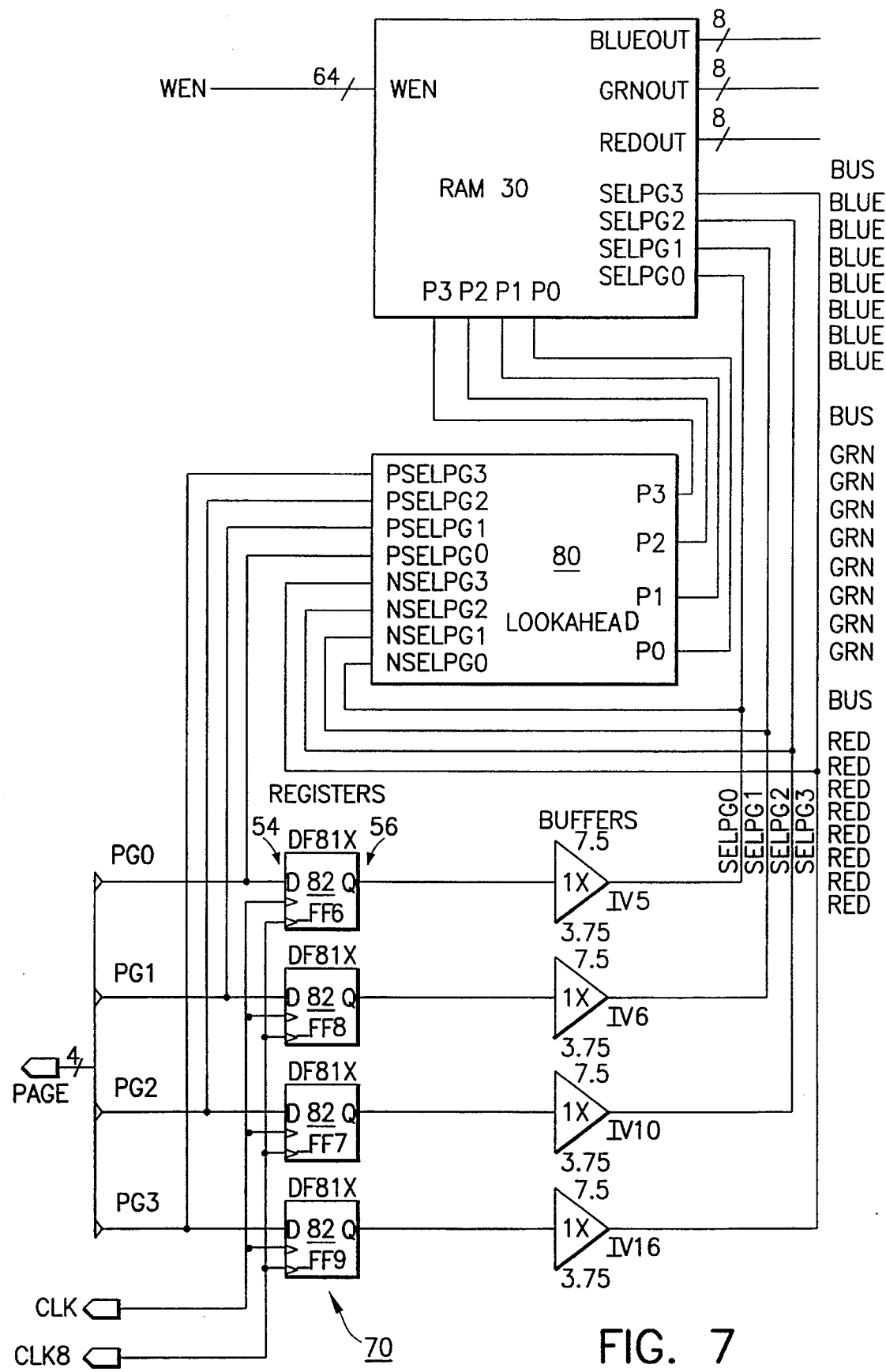
FIG. 7 is a detailed diagram of the look-ahead arrangement of FIG. 5.
Figures 8, 8A:
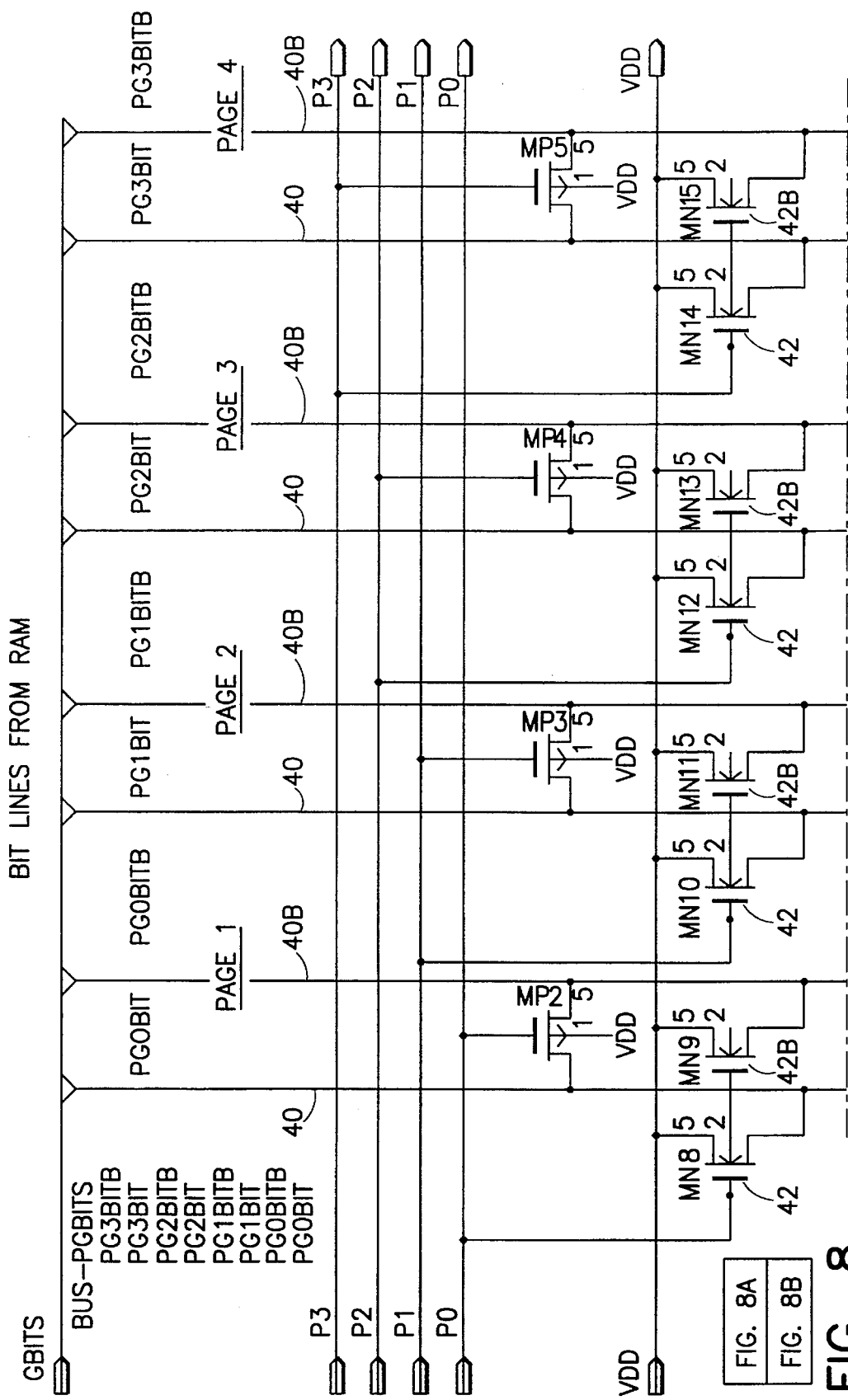
FIG. 8 is a diagram showing details of the pull-up current sources and the addressing circuitry for selecting a page of memory cells.
Figure 8B:
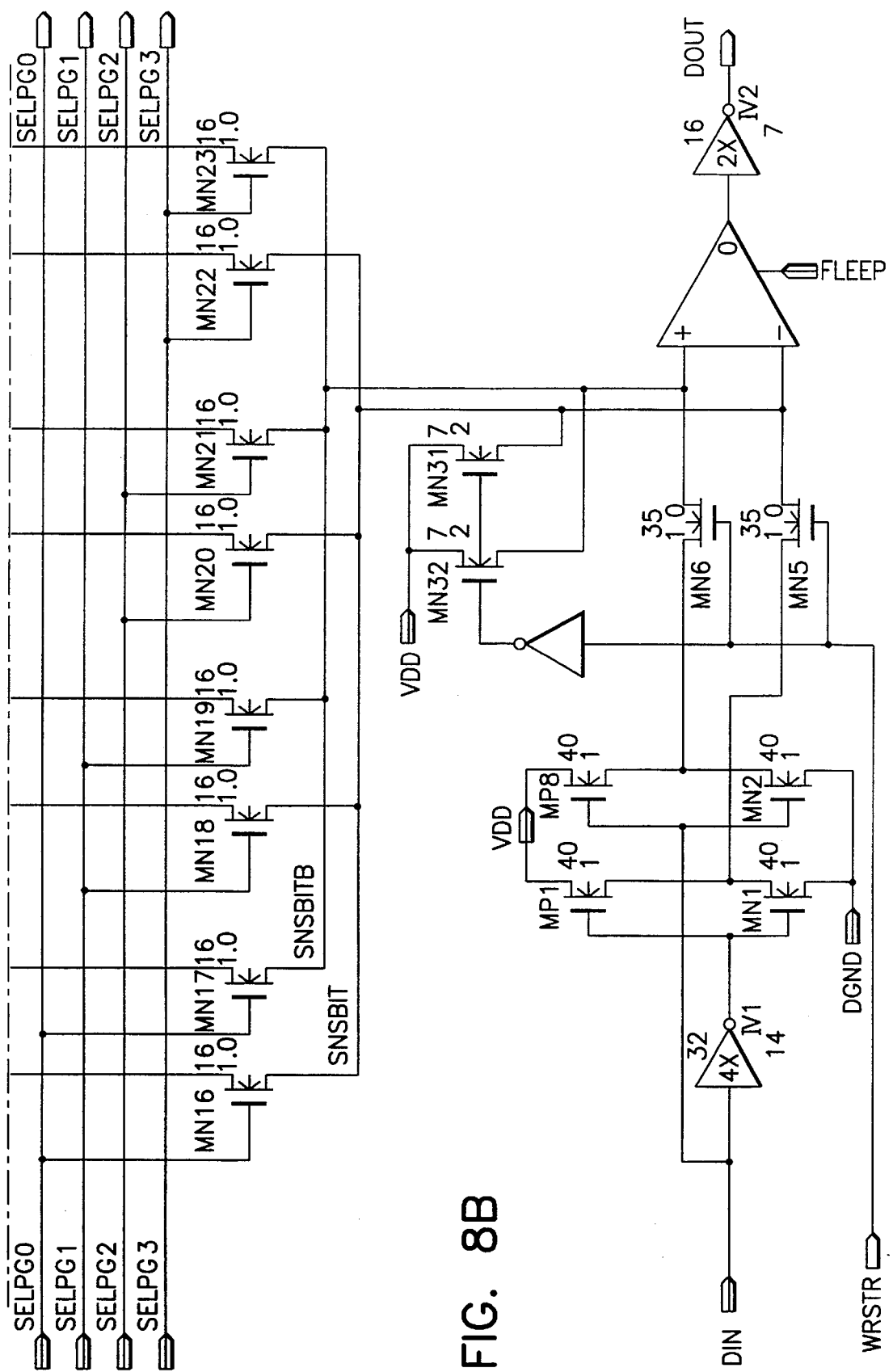

Referring to FIGS. 5 and 7, the sets of four "present" and "next" pulses are examined by "look-ahead" logic circuitry 80 to produce four corresponding signals P0–P3 for turning on/off the current sources (42, 42B) associated with the bit lines for the memory cells. A set of four flip-flops 82 serve as the registers 54, 56, as in the above-identified copending application Ser. No. 07/986,146 (see FIG. 4 thereof), producing the pulse signals for the logic circuitry 80. The input circuitry of each flip/flop serves as the "next" register 54, and its output circuitry serves as the "present" register 56. FIG. 8 shows details of the circuitry for controlling the current sources 42, 42B with the signals P0–P3.

Figures 9, 10:
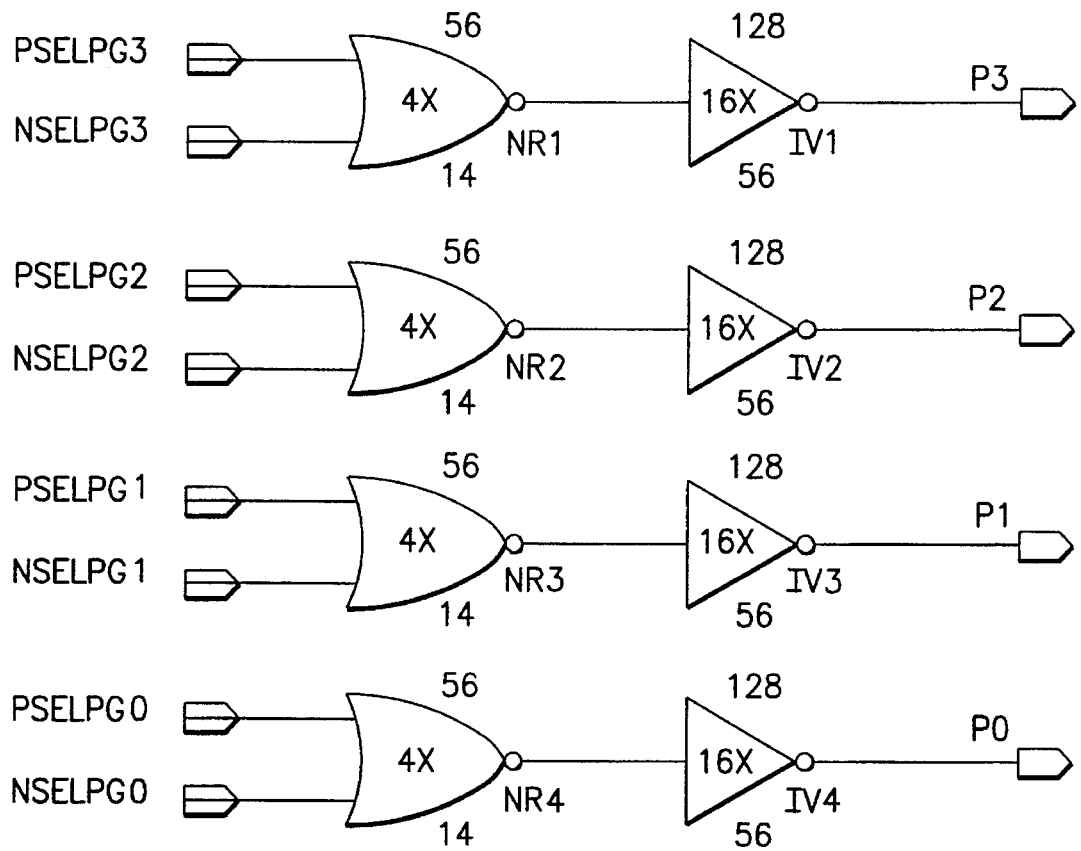
FIG. 9 is a diagram showing the logic circuitry for the look-ahead logic of FIG. 7.
FIG. 10 is a truth table for the logic circuitry of FIG. 9.

This logic circuitry 80 produces an "on" output for any of the four signals P0–P3 when either (or both) of the "present" or "next" control pulses for one memory page is a "one". An "off" output is produced when both of these pulses are "zero" for one memory page. FIG. 9 shows details of the logic circuitry 80, and FIG. 10 presents a truth table showing the output signals for the respective input signal conditions.

It will be evident that with the described embodiment, at least one-half of the current sources 42, 42B will be off at any given time, i.e., when the "next" pulse for one page is a "one", and the "present" pulse for another page is a "one". However, under some circumstances, 75% of the current sources will be off. In either event, substantial savings of power will be effected.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. In a digital device having a plurality of current sources arranged to be turned on selectively to produce an output current; said device further including means to develop control pulses serving to control said current sources and providing successive pipelined registers for pulses identified as the "present" pulse and the "next" pulse; the method of controlling the status of said current sources comprising the steps of:

examining the states of said "present" pulse and said "next" pulse; and controlling said current sources to prevent any flow of current when the states of both said examined pulses are such as to establish that the source current be turned off.

2. The method of claim 1, including the step of turning on the current sources when either one or the other (or both) of said present and next pulses calls for the sources to be on.

3. The method of claim 1, wherein said present and next pulses control current sources used to activate memory cells.

4. The method of claim 3, wherein said memory cells are arranged in groups identified as pages; and directing said control pulses to activate the current sources for selected pages of memory cells while turning off at least a portion of the current sources for the remaining pages of memory cells.

\* \* \* \* \*